(12) United States Patent
Sakai et al.

(10) Patent No.: US 10,031,332 B1
(45) Date of Patent: Jul. 24, 2018

(54) THIN FILM TRANSISTOR FOR ELECTROWETTING DISPLAY ELEMENT

(71) Applicant: Amazon Technologies, Inc., Seattle, WA (US)

(72) Inventors: Toru Sakai, Waalre (NL); Abhishek Kumar, Tilburg (NL)

(73) Assignee: Amazon Technologies, Inc., Seattle, WA (US)

( * ) Notice: Subject to any disclaimer, the term of this patent is extended or adjusted under 35 U.S.C. 154(b) by 26 days.

(21) Appl. No.: 14/980,752

(22) Filed: Dec. 28, 2015

(51) Int. Cl.
    *G02B 26/00* (2006.01)
    *H01L 29/786* (2006.01)
    *H01L 27/12* (2006.01)

(52) U.S. Cl.
    CPC ........ *G02B 26/005* (2013.01); *H01L 27/1255* (2013.01); *H01L 29/78633* (2013.01); *H01L 29/78696* (2013.01)

(58) Field of Classification Search
    CPC   G02B 26/004; G02B 26/005; G02B 26/0841; G09G 3/348
    USPC .................................................. 359/290–292
    See application file for complete search history.

(56) References Cited

U.S. PATENT DOCUMENTS

| | | | | |
|---|---|---|---|---|
| 2010/0102314 | A1* | 4/2010 | Miyairi | ............. H01L 29/42384 257/43 |
| 2012/0262774 | A1* | 10/2012 | Bae | ...................... G02B 26/005 359/290 |
| 2013/0329274 | A1* | 12/2013 | Yang | .................... G02B 26/005 359/290 |
| 2014/0313177 | A1* | 10/2014 | Van Dijk | ................. G02B 3/14 345/211 |
| 2015/0311477 | A1* | 10/2015 | Cho | .................... H01L 51/5284 257/40 |

OTHER PUBLICATIONS

Merriam-Webster Dictionary; https://www.merriam-webster.com/dictionary/underlying; Oct. 27, 2017.*

* cited by examiner

*Primary Examiner* — Stephone B Allen
*Assistant Examiner* — Rahman Abdur
(74) *Attorney, Agent, or Firm* — EIP US LLP (57) ABSTRACT

Electrowetting display elements comprising a thin film transistor are disclosed. In examples, the thin film transistor may comprise a first gate terminal, a semiconducting channel overlying at least a portion of the first gate terminal, a source terminal formed on at least a first portion of the semiconducting channel, and a drain terminal formed on at least a second portion of the semiconducting channel, different from the first portion of the semiconducting channel. The source and drain terminals may form an inter-terminal region of the semiconducting channel located between the source terminal and the drain terminal. A second gate terminal may be formed overlying at least a portion of the inter-terminal region so as to shield the inter-terminal region from light and to increase the conductivity of the semiconducting channel.

30 Claims, 6 Drawing Sheets

THIN FILM TRANSISTOR FOR ELECTROWETTING DISPLAY ELEMENT

BACKGROUND

Electrowetting display devices may comprise electrowetting display elements, wherein an oil layer covers a display area of a particular display element when that display element is in an off state, and wherein the oil layer is retracted so as to cover less of the display area when the display element is in an on state. In particular, to switch the display element to the on state, a voltage is applied to an electrically conductive fluid via an electrode, the electrically conductive fluid being in contact with, but immiscible with, the oil. To switch the display element to the off state, the voltage is switched off.

Light incident upon the display element may generate current inside a semiconducting channel of a thin film transistor. It is desirable to reduce this effect.

DETAILED DESCRIPTION

Electrowetting display elements may include many aspects, including a thin-film transistor (TFT) for switching the electrowetting display element between display states (e.g., on and off). In general, a TFT has at least a gate terminal, a source terminal, a drain terminal, and a semiconducting channel. Generally, the gate terminal, source terminal, and drain terminal are formed of a conductive material, such as a metal, which may also be reflective of light. The channel, on the other hand, may generally be formed of a semiconducting material that may be absorbent of light and which may further cause a photocurrent in the TFT.

Absorption of light by the semiconducting channel and resulting photocurrent within the TFT can affect performance of the display element. For example, the photocurrent can cause cross-talk, e.g., capacitive, inductive, or conductive coupling from one part of a display element to another, or between adjacent display elements, or between the display element and other components within a display device, such as other control circuitry.

It is possible to suppress unwanted photocurrent in a display element by forming a light shield over a TFT. The light shield may function by reflecting, absorbing, diverting, or otherwise preventing light from reaching underlying aspects of a display element, such as the TFT. In some examples, the light shield will be made of a reflective metal material in order to reflect incident light away from underlying aspects of a display element, such as the semiconducting channel. However, a metallic light shield may lead to capacitive coupling between the source terminal and/or drain terminal and the light shield. The capacitive coupling may undesirably increase power consumption of display element and may further cause a kick-back effect in the display element, which can affect the performance of the display state of the display element.

Shielding the semiconducting channel without creating capacitive coupling with underlying conductive structures, such as the source terminal and the drain terminal, is achieved for example to dispose a light shield in a position overlying the semiconducting channel, but not overlying the source terminal or drain terminal. In this way, the light shield may block (e.g., by reflecting) incident light from the semiconducting channel without creating the undesirable effects discussed above.

By forming the light shield of a conductive material and connecting it electrically to an underlying gate terminal, the light shield may act as a second gate terminal to the TFT. Having a second gate terminal for the TFT may beneficially increase the conductivity of the semiconducting channel when an appropriate voltage is applied to the first and second gate terminals. In some examples, the TFT may be reduced in size as a benefit of the increased channel conductivity.

Further, where the second gate terminal is formed of the same material as other aspects of the display element, such as an electrode, it may be possible to form the second gate terminal and electrode in the same manufacturing step. In such cases, the addition of the second gate terminal to the TFT requires minimal modification of existing manufacturing steps.

Examples will now be described with reference to the Figures. It is to be appreciated that some features described in such examples are similar to features described in other examples, and that therefore corresponding descriptions should be taken to apply where appropriate. Moreover, as the skilled person will readily appreciate, features described in one example are not necessarily limited to only that example. Features of one example may be appropriate for incorporation in other examples, as the skilled person will appreciate.

Figure 1:
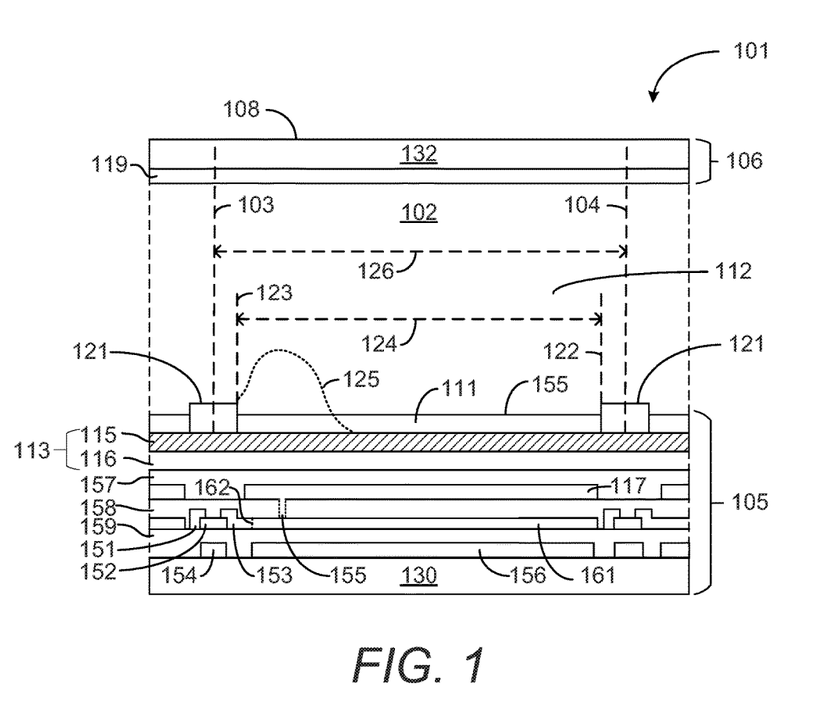
FIG. 1 shows schematically an example electrowetting display element.

FIG. 1 shows a diagrammatic cross-section of part of an example of an electrowetting display device 101. Display device 101 may be of several types, including: reflective, transmissive or transflective type. Display device 101 may be an active matrix driven or a direct drive display device. Display device 101 includes a viewing side 108 upon which an image or display formed by the display device can be viewed as well as a rear side 109.

Electrowetting display device 101, includes a plurality of display elements, such as display element 102, which may also be referred to as electrowetting display elements, picture elements, electrowetting elements, or pixels. In particular, display element 102 is an example of an electrowetting display element that may produce a display effect. Display element 102 may be monochrome or color. In some examples of a color display device, the display elements may be divided into groups, each group having a different color, while in other examples, an individual display element, such as display element 102, may be able to produce different colors.

Display element 102 comprises a first support plate 105 and a second support plate 106. First support plate 105 and second support plate 106 may be separate parts of each display element, or the support plates may be shared in common by a plurality of display elements. First support plate 105 and second support plate 106 may include a glass or polymer substrate 130 and substrate 132, respectively, and may be rigid or flexible. First support plate 105 and second support plate 106 of display element 102 may also include further aspects, such as: wettable layer 115, barrier layer 116, walls 121, circuitry for controlling the display elements (e.g., electrodes 117 and 119, signal lines (not shown), thin film transistors), and others aspects that are not depicted in FIG. 1 for clarity.

In the example display element 102 depicted in FIG. 1, the extent of display element 102 is indicated by the arrow 126 extending between dashed lines 103 and 104, which emanate from the center of walls 121 of display element 102. Further, in this example, the area of the surface between walls 121, indicated by arrow 124 extending between dashed lines 122 and 123, may be referred to as the display area 124, over which a display effect occurs. In examples, the display area may correspond with the surface area of the wettable layer, such as wettable layer 115 in FIG. 1, which is bounded by one or more walls, such as walls 121 in FIG. 1, and which is adjoined by at least one of the first or second fluids, such as first fluid 111 and second fluid 112 in FIG. 1.

Display element 102 includes space 110, which may otherwise be considered to be a chamber, between support plates 105 and 106, and which may be filled with a plurality of fluids. In the example of FIG. 1, space 110 is filled with first fluid 111 and second fluid 112.

In the example depicted in FIG. 1, first fluid 111 is electrically non-conductive. For example, first fluid 111 may include an alkane, like decane or hexadecane, a silicone oil, or decalin. First fluid 111 may also absorb at least a part of the visible light spectrum. For example, first fluid 111 may be translucent for a part of the visible light spectrum, thereby forming a color filter. First fluid 111 may also be colored by addition of pigment particles or a dye. In some examples, first fluid 111 may be black and may absorb substantially all parts of the visible light spectrum. In some example, first fluid 111 may be reflective. For example, first fluid 111 may reflect the entire visible spectrum, making the fluid layer appear white, or may reflect only part of the visible light spectrum, making the fluid layer have a color. In some example, first fluid 111 may not absorb all wavelengths within a given spectrum, but may absorb the majority of wavelengths within the given spectrum. Thus, first fluid 111 may be configured to absorb substantially all light incident thereupon. In some example, first fluid 111 may absorb 90% or more of light in the visible spectrum and incident thereupon.

First fluid 111 may be confined to display element 102 by walls 121, which follow the cross-section of display element 102. The cross-section of a display element may have any shape. When the display elements are arranged in a matrix form, the cross-section of each display element may usually be square or rectangular. In FIG. 1, walls 121 are shown as structures formed or disposed on a surface of and protruding from wettable layer 115. In examples, forming, disposing, or otherwise arranging an element of an electrowetting display element may be accomplished through, for example, chemical vapor deposition (CVD), or one of its variants, such as plasma-enhanced chemical vapor deposition, or physical vapor deposition (PVD), and other processes known to those of skill in the art. Further, forming or disposing a second structure (e.g. a wall) on a first structure (e.g. a surface) may mean directly on (e.g., in contact with) or indirectly on, such as where there are one or more intervening structures (e.g., layers) and the second structure is above, overlying, or overlapping the first structure aspect through the intervening structures. In other examples, walls 121 may instead be part of a surface layer of the support plate that repels the first fluid, such as a hydrophilic or less hydrophobic layer. In the example shown in FIG. 1, walls 121 extend only partly from first support plate 105 to second support plate 106. However, in other examples, walls may extend fully from first support plate 105 to second support plate 106.

In the example depicted in FIG. 1, second fluid 112 is electrically conductive, polar, or both. Electrically conductive may mean that second fluid 112 is capable of conducting electricity; that is, an electrical current may flow through second fluid 112 due to the flow of ions through second fluid 112. Polar may mean that second fluid 112 comprises at least one component having a molecule with a net dipole; that is, a molecule with an overall dipole moment across the molecular structure due to an electron distribution within the molecule, wherein at least one part of the molecule has a negative electrical charge and at least one different part of the molecule has a positive electrical charge. Such dipole moments may include permanent dipoles. Polarity may be caused, for example, by the presence of one or more atom-to-atom bond in the molecule, with, for example, one of the atoms being a heteroatom, such as oxygen or nitrogen. Such a polar atom-to-atom bond may be a bond between an oxygen (O) atom and a hydrogen (H) atom, such as an —O—H bond, which may be in some examples due to the presence of at least one hydroxyl (—OH) group. The presence of such bonds may cause hydrogen bonding between different molecules within second fluid 112.

In some example, second fluid 112 may be water, or a salt solution, such as a solution of potassium chloride in water. In some example, second fluid 112 may be translucent or colored. Examples of colored fluids may also be referred to as selective color absorbing fluids.

In this example depicted in FIG. 1, first fluid 111 is substantially immiscible with second fluid 112, which is to say that first fluid 111 and second fluid 112 do not substantially mix with each other. In some examples, first fluid 111 and second fluid 112 do not mix with each other to any degree, while in other examples there may be some degree of mixing of first fluid 111 and second fluid 112. Even in such cases, the degree of mixing may be considered negligible in that the majority of the volume of first fluid 111 is not mixed with the majority of the volume of second fluid 112. The substantial immiscibility of first fluid 111 and second fluid 112 may be due to the properties of each fluids, such as, for example, their chemical compositions.

Due to the immiscibility of first fluid 111 with second fluid 112, first fluid 111 and second fluid 112 tend to remain separated from each other, therefore tending not to mix together to form a homogeneous mixture. Instead, first fluid 111 and second fluid 112 may meet each other at an interface, which may alternatively be referred to as a boundary or a meniscus. The relative thickness of the first fluid 111 layer and the second fluid 112 layer depicted in FIG. 1 are examples; in other examples, the first fluid 111 layer and the second fluid 112 layer (and potentially other fluid layers) may have different thicknesses.

FIG. 1 depicts an example of an interface 155 that may exist when no voltage is applied to display element 102, and another example of an interface 125 that max exist when a voltage is applied to display element 102. Interfaces 155 and 125 each indicate a boundary between the volume of first fluid 111 and the volume of second fluid 112. The location and shape of the interface between first fluid 111 and second fluid 112 may be affected by the voltage applied to display element 102 and may cause a display effect.

A display effect for display element 102 may depend on both the extent that first fluid 111 and second fluid 112 adjoin the surface defined by the display area 124, and the magnitude of a voltage applied to display element 102. In some examples, first fluid 111 may cover all or the majority of the display area 124 when no voltage is applied to the display element 102, while in other examples, first fluid 111 may cover less than all or the majority of display area 124 when no voltage is applied to the display element 102.

In the example depicted in FIG. 1, when there is no voltage being applied to display element 102, first fluid 111 adheres preferentially to the surface of wettable layer 115 because the surface of wettable layer 115 has a greater wettability for first fluid 111 than for second fluid 112. When, instead, the applied voltage is a sufficient, non-zero driving voltage, the surface of wettable layer 115 has a greater wettability for second fluid 112 than for the first fluid 111. Thus, the driving voltage applied to display element 102 may cause a display effect by altering the configuration of first fluid 111 and second fluid 112 within display element 102. For example, dashed line 125 depicts an alternative fluid arrangement of display element 102 when display element 102 is in an on state. In particular, first fluid 111 has been displaced against wall 121 by second fluid 112, which is more wettable to wettable surface 115 during the on state.

In the example depicted in FIG. 1, first support plate 105 includes insulating layer 113. Insulating layer 113 may be translucent, for example fully transparent or transmissive to visible light. Insulating layer 113 may extend between walls 121 of display element 102. To avoid short circuits between second fluid 112 and electrode 117 under insulating layer 113, insulating layer 113 may extend uninterrupted over a plurality of display elements. Insulating layer 113 includes surface 114 closest to space 110 of display element 102.

Insulating layer 113 may include a wettable layer 115. Wettability relates to the relative affinity of a fluid for the surface of a solid. Wettability may be measured by the contact angle between a boundary of the fluid and the surface of the solid. The contact angle is determined by the difference in surface tension between the fluid and the solid at the fluid-solid boundary. For example, a high difference in surface tension can indicate hydrophobic properties. As the skilled person will appreciate, a material may be considered to be hydrophobic if the contact angle with water is greater than 90 degrees; a material may therefore be considered to be hydrophilic if the contact angle with water is less than 90 degrees.

In some examples, a wettable layer may be a hydrophobic layer, for example, formed of a hydrophobic material, such as Teflon AF1600®. In some examples, a hydrophobic layer comprises more than 80%, more than 90%, more than 95%, approximately 100% or 100% of a hydrophobic material by weight or by volume. The remainder of the hydrophobic layer may, for example, be formed of a different material than a hydrophobic material.

In the example depicted in FIG. 1, display element 102 includes a first electrode 117 as part of the support plate 105. In this example, there is one first electrode 117 per display element. In other examples, there may be more than one electrode as part of support plate 105. First electrode 117 may be of any desired shape or form. In some examples, first electrode 117 also acts as a reflective surface, such as in the case of a reflective type display element. In such examples, first electrode may be formed of a reflective and conductive material, such as a metallic material. In some examples, first electrode 117 is formed of aluminum. In some examples, first electrode 117 is separated from barrier layer 116 by an insulating layer 157. The insulating layer 157 may be a layer comprising a dielectric material, which is a very poor conductor of electric current. When a dielectric material is placed in an electric field, no current may flow in the material because, unlike metals, they have no loosely bound, or free, electrons that may flow through the material.

First electrode 117 of display element 102 is supplied with voltage signals by a signal line (not shown). First electrode 117 is electrically insulated from first fluid 111 and second fluid 112 by insulating layer 113. In some examples, electrodes of neighboring display elements may be separated by a non-conducting layer, while in other examples, electrodes of neighboring display elements may be electrically connected. In some examples, further layers may be arranged between insulating layer 113 and first electrode 117.

In the example depicted in FIG. 1, second support plate 106 includes second electrode 119, which is connected to second signal line (not shown), and which extends between walls of display element 102. In some examples, second electrode 119 may be disposed or formed, for example located, above and/or covering, overlying, or overlapping the walls of the display element and/or extend uninterruptedly over a plurality of display elements. Alternatively, the second electrode 119 may be arranged at a border of second support plate 106, where it is in electrical contact with second fluid 112. In the example depicted in FIG. 1, second electrode 119 is uninterrupted by walls 121 and is fluidly interconnected to all display elements by shared second fluid 112. Thus, second electrode 119 is common to all display elements in the example shown in FIG. 1.

First electrode 117 and second electrode 119 may be made of, for example, a translucent conductive material, such as indium tin oxide (ITO).

In the example depicted in FIG. 1, a switching element is used to control the voltage applied to first electrode 117, and in-turn for controlling application of a voltage between first electrode 117 and second electrode 119 of display element 102. In this example, the switching element is a transistor such as a thin film transistor (TFT), which is located in first support plate 105. The TFT includes a source terminal 151, a drain terminal 153, which is electrically connected to first electrode 117, a semiconducting channel 152 connecting source terminal 151 to drain terminal 153, and a gate terminal 154. In examples, various terminal, such as the gate, source and drain terminals, may be electrically conductive structures, such as a node, trace, or other type of connection in an electronic circuit. While the figures depict various example terminals with specific shapes and arrangements, those of skill in the art will appreciate that such terminals may have other shapes and arrangement as the case may be, and may include complex geometries. In some examples, one or more of gate terminal 154, source terminal 151, and drain terminal 153 may comprise materials such as molybdenum, aluminum, titanium, copper, or other conductive materials as are known by those of skill in the art, such as other metals and metal alloys. Further, in this example, gate terminal 154 is separated from semiconducting channel 152 by an insulating layer 159, which may comprise a dielectric material DM thereby electrically insulating gate terminal 154 from semiconducting channel 152. Further, source terminal 151, semiconducting channel 152, and drain terminal 153 may be separated from first electrode 117 by an insulating layer 158, which may comprise a dielectric material.

As described above, in some examples, first electrode 117 may be made of a translucent conductive material such as ITO. In examples where first electrode is made of a translucent material, there may be a separate layer with a reflective surface, such as a reflector, which may be used to reflect light back out of the display element (e.g., in the case of reflective or transreflective display types). In other examples, first electrode 117 may be made of a reflective conductive material instead, such as a metallic material or a metallic alloy material. In such examples, first electrode 117 may act as a reflector in addition to an electrode.

In the example depicted in FIG. 1, drain terminal 153 is electrically connected to first electrode 117 via contact hole 155 (referred to herein also as a second contact hole), which may be, for example, a via, or other electrical interconnect as are known by persons of skill in the art. Contact hole 155 may be formed through insulating layer 158 by, for example, physical or chemical etching, and other methods as are known by those of skill in the art. Once formed, contact hole 155 may have a conductive material, such as a metallic material, deposited on its inner surface in order to electrically connect drain terminal 153 with first electrode 117.

Source terminal 151 may be supplied with a voltage by a source signal line (not shown). Gate terminal 154 is supplied with a voltage by a gate signal line (not shown). As is known to the skilled person, a voltage may be applied to first electrode 117 by applying a suitable electric potential to gate terminal 154, which thereafter changes a state of the semiconducting channel 152 from an electrically non-conducting state to an electrically conducting state. Thus, the transistor may be switched to an electrically conducting state so that the voltage applied to source terminal 151 may be conducted via semiconducting channel 152 to first electrode 117 via drain terminal 153. In other words, a flow of electric current between source terminal 151 and drain terminal 153, via semiconducting channel 152, is controllable by application of a voltage to gate terminal 154.

In examples of active matrix display elements, source terminal 151 may be connected by a source signal line (not shown) to a column driver (not shown) and gate terminal 154 may be connected by a gate signal line (not shown) to a row driver (not shown) in order to control the magnitude of and when an electric potential is applied to first electrode 117 thereby further controlling a configuration of first fluid 111 and second fluid 112.

In the example depicted in FIG. 1, gate terminal 154 is formed as a layer of electrically conductive metal on substrate 130 of first support plate 105. Thereafter, an insulating layer 159 comprising a dielectric material, such as silicon nitride or silicon dioxide, is formed on gate terminal 154.

Semiconducting channel 152 is formed as a layer of semiconducting material on insulating layer 159 such that semiconducting channel 152 at least partly overlaps gate terminal 154. In some examples, semiconducting channel 152 may be formed of a semiconducting material such as that used to form first electrode 117 and drain terminal 153, while source terminal 151 and gate terminal 154 may for example be formed from other materials, such as molybdenum (Mo), an alloy including molybdenum (Mo) and chromium (Cr), or aluminum (Al).

Source terminal 151 and drain terminal 153 are formed from electrically conductive material. Source terminal 151 and drain terminal 153 do not contact each other, but instead are connected to each other by semiconducting channel 152, between drain terminal 153 and source terminal 151. Thereafter, insulating layer 158 is formed, for example by depositing a dielectric material, over source terminal 151, gate terminal 152, and drain terminal 153.

First electrode 117 is formed on insulating layer 158. Thereafter, insulating layer 157 is formed upon which a barrier layer 116 is formed.

In the example depicted in FIG. 1, first support plate 105 also includes a first capacitor plate 156, which may form a storage capacitor with second capacitor plate 161. In some examples, such as the example depicted in FIG. 1, drain terminal 153 and second capacitor plate 161 may be electrically connected, such as at a connection point or a boundary 162, or otherwise drain terminal 153 and second capacitor plate 161 may be integrally formed. In the example depicted in FIG. 1, first capacitor plate 156 is separated from second capacitor plate 161 by insulating layer 159. In this example, the storage capacitor is connected in parallel with the capacitor formed by first electrode 117 and second electrode 119. Consequently, a voltage may be applied between first electrode 117 and second electrode 119 for longer after switching the transistor off by removing the electric potential from gate terminal 154. First capacitor plate 156 may be formed of, for example, molybdenum (Mo), an alloy including molybdenum (Mo) and chromium (Cr), or aluminum (Al). In other examples, first capacitor plate 156 may not be present.

Figure 2:
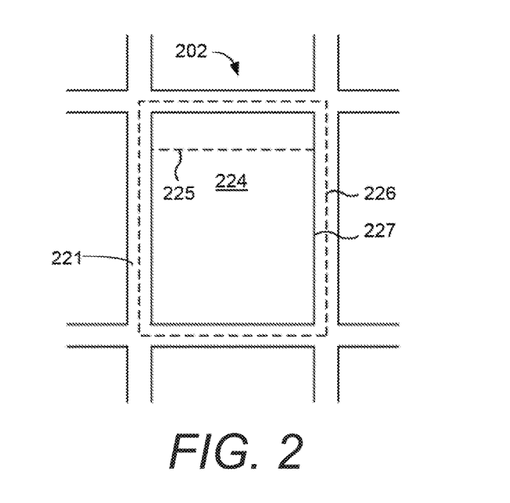
FIG. 2 shows schematically a plan view of the example electrowetting display element of FIG. 1.

FIG. 2 depicts part of a matrix of rectangular display elements in a plan view. For example, display element 202 may be the display element 102 of FIG. 1 depicted in a plan view. In the example display element 202 depicted in FIG. 2, the outer boundary of display element 202 is indicated by dashed line 226, which corresponds to dashed lines 103 and 104 in FIG. 1. Solid line 227 indicates the inner border of a wall 221 and is also the edge of display area 224 of display element 202. In this example, display area 224 is a hydrophobic surface of first support plate 105 of FIG. 1. Note that in other examples, the walls 221 of display element 202 may be formed into different shapes, for example, not square or rectangular. Further, in other examples, the display area 224 similarly be formed into different shapes, for example, not square or rectangular.

As described above, when a zero or substantially zero voltage is applied between first electrode 117 and second electrode 119 (shown in FIG. 1), i.e., when the electrowetting element is in an off state, first fluid 111 forms a layer extending between the walls 121, as shown in FIG. 1. When a non-zero voltage is applied between first electrode 117 and second electrode 119 (shown in FIG. 1), i.e., when the electrowetting element is in an on state, second fluid 112 will displace first fluid 111 such that first fluid 111 will retract (or contract) against a wall, as shown by the dashed shape 225 in FIG. 2 (and 125 in FIG. 1). Accordingly, the controllable displacement of first fluid 111 in dependence on the magnitude of the applied voltage is used to operate the display element as a light valve and to provide a display effect over display area 224. For example, displacing first fluid 111 to increase adjoinment of second fluid 112 with display area 224 may increase the brightness of the display effect provided by display element 102. The display state of display element 102 may therefore go from black to white, or to any intermediate grey state in a black and white display device; or from black to a color of varying brightness in a color display device.

Figure 3:
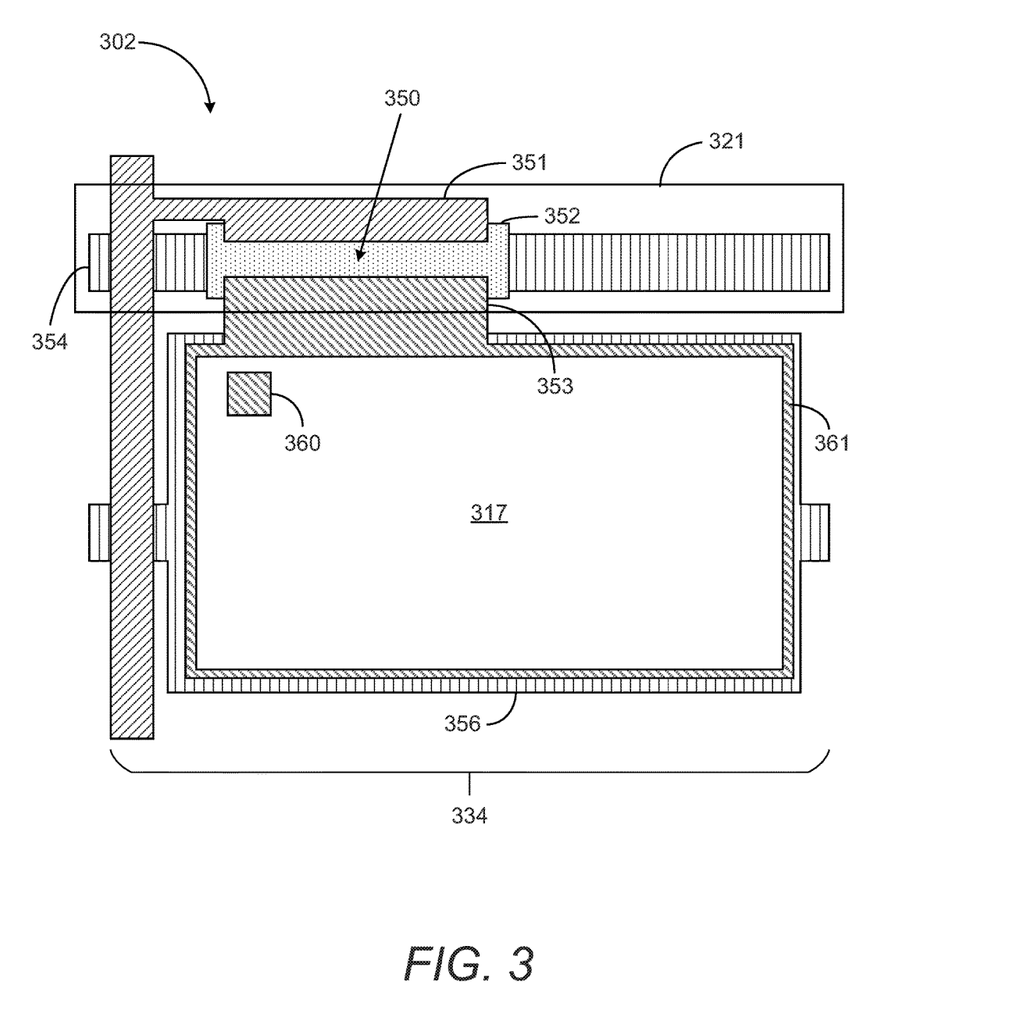
FIG. 3 shows schematically in plan view an example electrowetting display element.

FIG. 3 depicts a plan view of aspects of a display element 302. In particular, FIG. 3 depicts control circuitry of display element 302, including: a thin film transistor (TFT) 334.

TFT 334 includes a gate terminal 354; a first capacitor plate 356; a semiconducting channel 352 that is formed over a gate terminal 354; a source terminal 351 and a drain terminal 353 that are formed above gate terminal 354 and over portions of semiconducting channel 352; a second capacitor plate 361, which is integrally formed with drain terminal 353; and a contact hole 360 which connects drain terminal 353 to first electrode 317. Display element 302 also includes a wall 321, which in this example is made of a translucent material. Note that intervening layers, such as a barrier layer and a wettable layer (described above) are not shown in FIG. 3 for clarity. The aforementioned features may be similar to those described above with respect to FIG. 1.

As is depicted in FIG. 3, incident light 350 may come through the translucent layers of display element 302, including the translucent wall 321, and impact the semiconducting channel 352. As described above, such incident light 350 may cause a photocurrent in semiconducting channel 352 that negatively affects other aspects of the control circuitry for display element 302 as well as control circuitry in adjacent pixels.

Figure 4A:
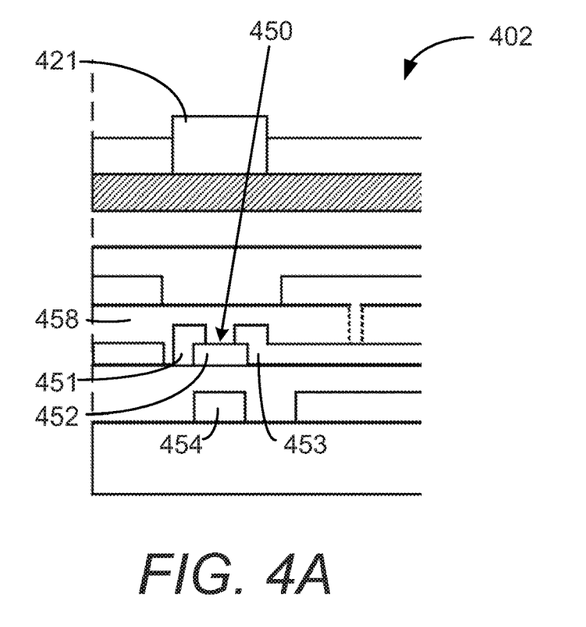
FIG. 4A shows schematically an example of layers of a support plate of an example electrowetting display element.

FIG. 4A depicts a portion of a display element 402 of an electrowetting display device, such as display element 102 described above with respect to FIG. 1. As described above, display element 402 includes a thin film transistor (TFT) 434, which comprises a first gate terminal 454, a source terminal 451, a semiconducting channel 452, and a drain terminal 453. TFT 434 is one aspect of the control circuitry for display element 402. Display element 402 includes other aspects, such as those described above with respect to FIG. 1, which are not shown in FIG. 3 for clarity.

As depicted in FIG. 4A, light 450 passes through a translucent portion of wall 421. Light 450 may be, for example, incident light from the environment. In some examples, light 450 might also pass through a translucent electrode (e.g., made of a translucent material such as ITO). Light 450 ultimately impacts semiconducting channel 452 of TFT 434, which causes a photocurrent to be generated inside semiconducting channel 452. The photocurrent induced in semiconducting channel 452 may further cause undesirable cross-talk, e.g., undesired capacitive, inductive, or conductive coupling from one part of display element 402 to another, or between display element 402 and adjacent display elements (such as shown in FIG. 2), or between display element 402 and other components within a display device, such as other control circuitry.

Figure 4B:
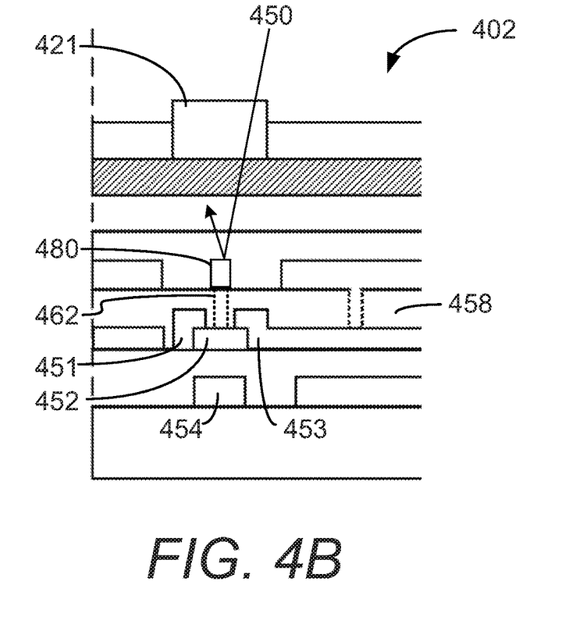
FIG. 4B shows schematically an example of layers of a support plate of an example electrowetting display element, including a second gate terminal.

In order to suppress photo current, it is possible to form a light shield 480 over TFT 434, such as depicted in FIG. 4B. As depicted in FIG. 4B, light 450 impacts light shield 480 and is reflected away from underlying circuitry, such as semiconducting channel 452. Light shield 480 may function by reflecting, absorbing, diverting, or otherwise preventing light from reaching underlying circuitry, such as semiconducting channel 452. In some examples, light shield 480 may be made of a reflective metal material in order to reflect incident light away from underlying circuitry, such as semiconducting channel 452. However, a metallic light shield may lead to undesirable capacitive coupling between, for example, source terminal 451 and/or drain terminal 453 and light shield 480. The capacitive coupling may undesirably increase power consumption of display element 402 and may further cause a kick-back effect in the display unit, where kick-back is caused by, with the TFT switched off, a parasitic capacitance effect discharging the capacitor formed between the second fluid and the electrode, which can undesirably change the display effect by changing the configuration of the first and second fluids. In order to avoid parasitic capacitance, light shield 480 may be positioned above semiconducting channel 452, in other words, overlapping semiconducting channel 452, but not overlapping source terminal 451 or drain terminal 453.

In examples with a light shield formed above an underlying semiconducting channel, such as in FIG. 4B, there may be an insulator in-between the semiconducting channel and the light shield, such as insulating layer 458. In examples where light shield 480 is made of a conductive material, such as a metal, it may be further electrically connected to first gate terminal 454 by way of, for example, a contact hole 462 through insulating layer 458. In this way, light shield 480 may also act as (and be referred to as) a second gate terminal 480. Accordingly, in examples where first gate terminal 454 is electrically connected to light shield/second gate terminal 480, any voltage applied to first gate terminal 454 will cause a voltage to also be applied to light shield/second gate terminal 480, which may beneficially increase the current flow across semiconducting channel 452. Thus, light shield 480 may serve an additional purpose as a second gate terminal to TFT 434.

Figure 5A:
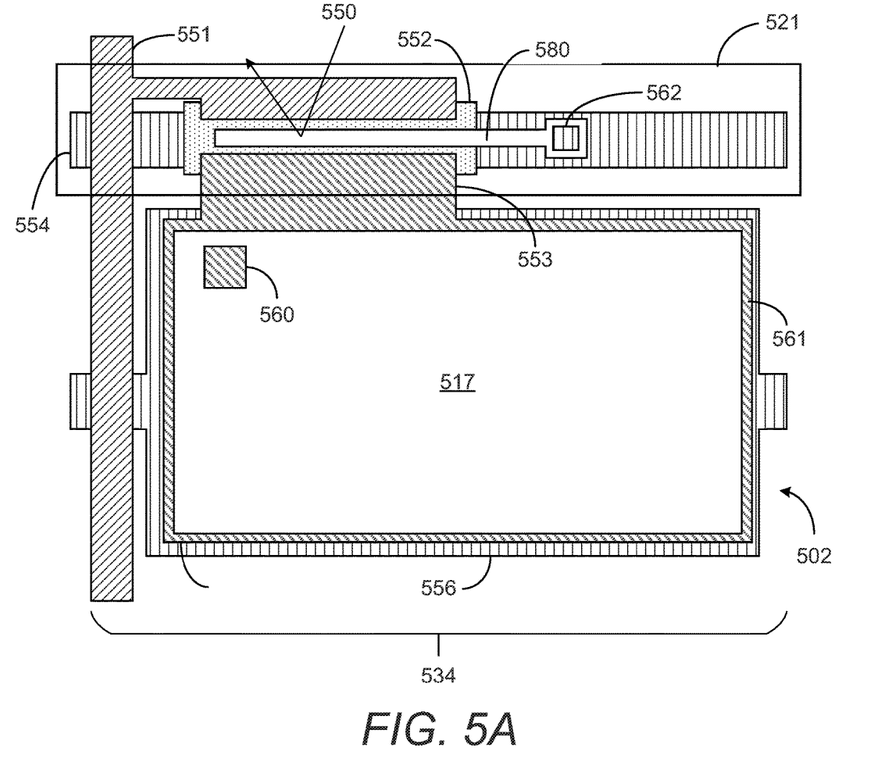
FIG. 5A shows schematically in plan view an example electrowetting display element with a second gate terminal.

FIG. 5A depicts a plan view of aspects of a display element 502. Like in FIG. 4, display element 502 includes control circuitry such as a thin film transistor (TFT) 534. TFT 534 includes a first gate terminal 554 located to apply a first gate voltage; a semiconducting channel 552 that is formed over a portion of first gate terminal 554; a source terminal 551 and a drain terminal 553 that are formed above first gate terminal 554 and semiconducting channel 552; a second capacitor plate 561, which is integrally formed with drain terminal 553; and a contact hole 560 which connects drain terminal 553 to first electrode 517. Display element 502 also includes a wall 521. Note that intervening layers, such as the barrier layer and wettable layer, as well as other aspects of display element 502, such as those described above, are not shown in FIG. 5A for clarity. The aforementioned features may be similar to those described above with respect to FIGS. 1-3.

FIG. 5A also depicts new features of display element 502 as compared to display element 402 in FIG. 3. Namely, display element 502 includes a second gate terminal 580 located to apply a second gate voltage, which also acts as a second light shield. In this example, second gate terminal 580 is a metal layer that is both conductive and reflective of light, for example, aluminum, molybdenum, titanium, copper, and others as are known by a skilled person. In some examples, second gate terminal 580 may be formed of the same material as first electrode 517, while in others it may be formed of a different material.

In the example depicted in FIG. 5A, a portion, i.e. a part, of second gate terminal 580 is overlapping a portion of the semiconducting channel 552. The portion of second gate 580 overlapping semiconducting channel 552 may be referred to as a region of overlap, or otherwise an area or an extent of overlap. The term overlap may in examples be considered to indicate one element at least partly covering a different element, so in this example the portion of second gate terminal 580 covers, for example overlies, the portion of semiconducting channel 552. In examples, there may be at least one layer or material, for example an insulating layer, or a void, between the overlapping elements.

By positioning second gate terminal 580 above semiconducting channel 552, incident light upon semiconducting channel 552 is reduced, which also reduces the undesirable photo current effects described above. For example, as shown in FIG. 5A, incident light 550 impacts second gate terminal 580 and is reflected away from display element 502 rather than being absorbed by semiconducting channel 552, such as in the example depicted in FIG. 4. As such, second gate terminal 580 acts as a light shield for semiconducting channel 552.

Further, in this example, second gate terminal 580 acts as a light shield for semiconducting channel 552 without detrimentally increasing parasitic capacitive coupling because second gate terminal 580 is substantially non-overlapping with, in other words does not overlap within manufacturing tolerances, at least one of source terminal 551 or drain terminal 553 on either side of semiconducting channel 552. For example, referring to FIGS. 5A and 5B, if a perimeter of second gate terminal 580 was projected downwards towards semiconducting channel 552, the perimeter of second gate terminal 580 would fit within the inter-terminal region of semiconducting channel 552 without overlapping any part of source terminal 551 or gate terminal 553. Were second gate terminal 580 to overlap one or more of source terminal 551 or drain terminal 553, a parasitic capacitance may occur, which may increase a power consumption of the display element.

Figure 5B:
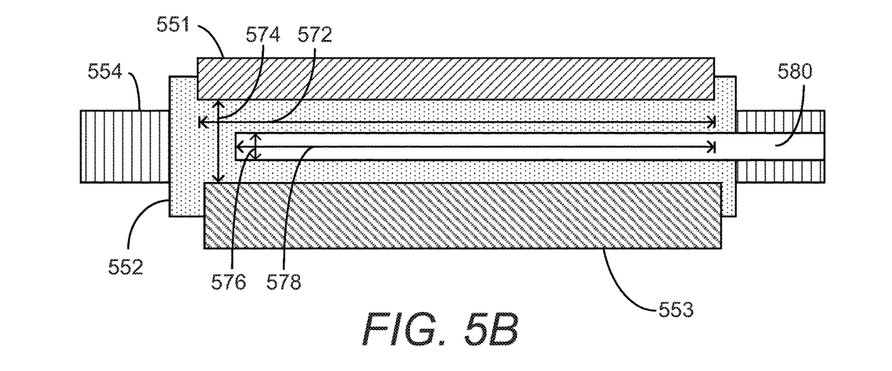
FIG. 5B shows schematically in plan view an example electrowetting display element with the second gate terminal.

Second gate terminal 580 may be formed with different widths and lengths, as discussed in more detail with respect to FIG. 5B. The width of second gate terminal 580 depicted in FIGS. 5A and 5B are just examples. In some examples, the width of second gate terminal 580 is equal to or less than the width of the semiconducting channel 552 between source terminal 551 and drain terminal 553 of TFT 534 in order to reduce capacitive coupling between second gate terminal 580 and source terminal 551 and drain terminal 553, which should in-turn reduce the power consumption of TFT 534.

Second gate terminal 580 is connected by way of contact hole 562 (referred to herein also as first contact hole) to the underlying first gate terminal 554. By connecting second gate terminal 580 to first gate terminal 554 through contact hole 562, second gate terminal 580, which is also conductive, may increase the conductivity of semiconducting channel 552 when a voltage is applied to second gate terminal 580. Consequently, the addition of second gate terminal 580 of TFT 534 may increase the conductivity of semiconducting channel 552 as compared to examples where only a first gate terminal (e.g., first gate terminal 554) is present, and increasing the conductivity of semiconducting channel 552 may beneficially increase the on current of TFT 534. Further, second gate terminal 580 may also beneficially decrease the off current of TFT 534 because the additional gate more readily depletes charge in the area of TFT 534. Further yet, increasing the conductivity of semiconducting channel 552 by way of second gate terminal 580 may also allow the overall TFT size to be beneficially reduced, which further lowers the power consumption of TFT 534.

Further, when the width of second gate terminal 580 is equal to or less than the width of the channel area between source terminal 551 and drain terminal 553 of TFT 534, there will be no increase in kick-back effect in display element voltage because there is no overlap between drain terminal 553 and second gate terminal 580.

In some examples, the width of second gate terminal 580 may be described in terms of a percentage of the width of the semiconducting channel between source terminal 551 and the drain terminal 553, which may be known as the transistor channel width by those of skill in the art.

FIG. 5B depicts an enlarged portion of FIG. 5A in order to better depict a width 576 and a length 578 of a portion of second gate terminal 580 overlapping a width 574 and a length 572 of a portion of semiconducting channel 552. The area defined by the width 574 and length 572 of semiconducting channel 552 may be referred to as the inter-terminal region or area, in other words the region or area of the semiconducting channel between source terminal 551 an drain terminal 553. In examples, the inter-terminal region between source terminal 551 and drain terminal 553 is where current will flow across semiconducting channel 552 when a voltage is applied to first gate terminal 554 and/or second gate terminal 580. In examples, the width 576 of second gate terminal 580 may be approximately 50% of inter-terminal region width 574, approximately 60% of inter-terminal region width 574, approximately 70% of inter-terminal region width 574, approximately 80% of inter-terminal region width 574, approximately 90% of inter-terminal region width 574, approximately 100% of inter-terminal region width 574, greater than 50% of inter-terminal region width 574, equal to inter-terminal region width 574, or other widths as may be determined by a person of skill in the art. Similarly, the length of the portion of second gate terminal 580 overlapping the inter-terminal region area of semiconducting channel 552 may be approximately 50% of inter-terminal region length 572, approximately 60% of inter-terminal region length 572, approximately 70% of inter-terminal region length 572, approximately 80% of inter-terminal region length 572, approximately 90% of inter-terminal region length 572, approximately 100% of inter-terminal region length 572, greater than 50% of inter-terminal region length 572, equal to inter-terminal region length 572, or other lengths as may be determined by a person of skill in the art. In other examples, the inter-terminal region width and length may be the same as the width and length of the semiconducting channel.

As above, not all layers and aspects of display element 502 are shown in FIGS. 5A and 5B for clarity. For example, in examples, second gate terminal 580 will be separated from underlying semiconducting channel 552 by an insulating layer of deposited dielectric material. Further, the shapes and relative sizes of aspects of the display element 502, such as the source terminal 551, drain terminal 553, first gate terminal 554, second gate terminal 580/second gate terminal 580, contact hole 562, and others are by way of example only. Other examples may have different shapes and relative sizes.

Figure 6:
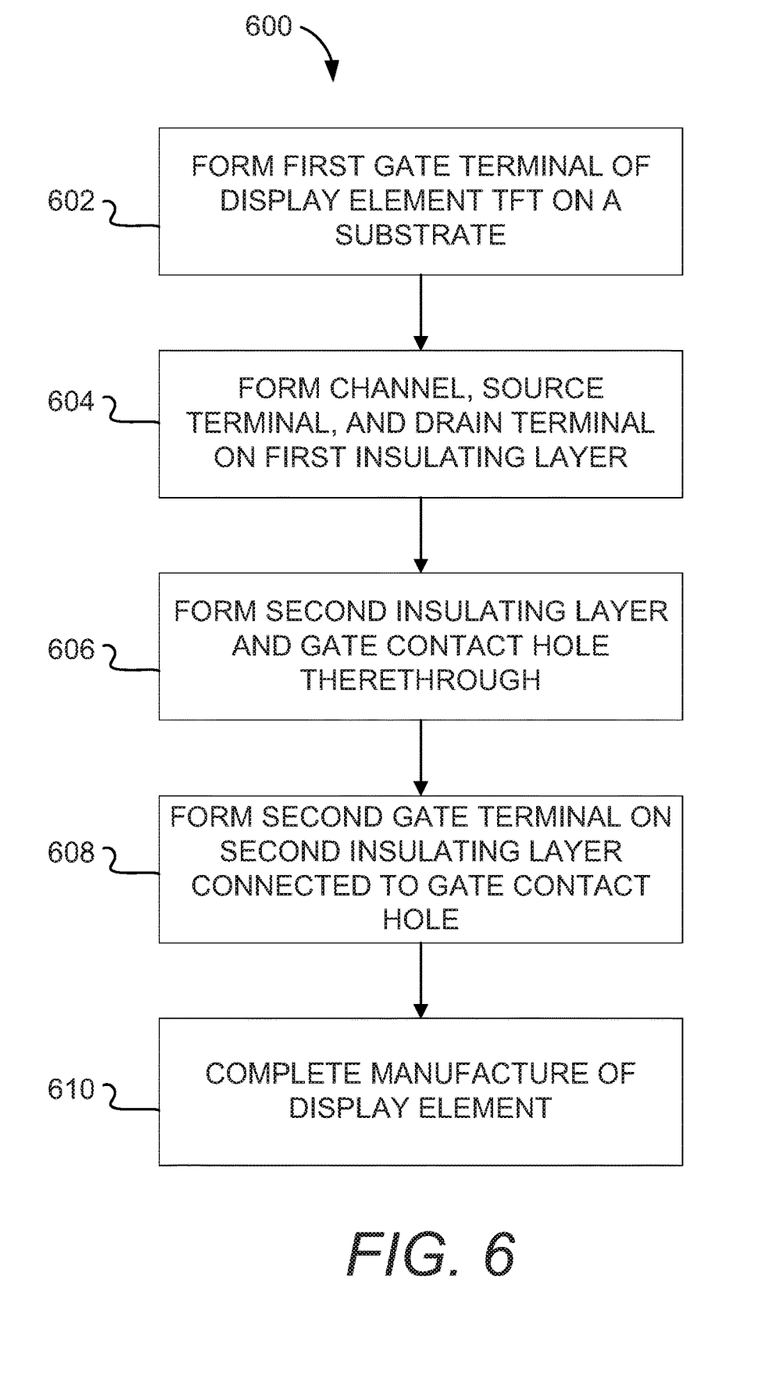
FIG. 6 is a flow diagram relating to examples of a method of manufacturing an electrowetting display element.

FIG. 6 depicts a method 600 for forming a display element including a second gate terminal that also acts as a second light shield. For example, method 600 may be applied to manufacture display elements such as those described with respect to FIGS. 5A and 5B.

In step 602 of method 600, a first gate terminal of a thin film transistor (TFT) in a display element is formed on a substrate, for example, such as substrate 130 in FIG. 1. As described above, the first gate terminal may be formed of materials such as molybdenum, aluminum, titanium, copper, or other conductive metals as are known by those of skill in the art. The shape of the gate terminal may be formed by manufacturing processes known to those of skill in the art, such as photo lithographic and chemical processing methods.

In step 604 of method 600, a channel, source terminal, and drain terminal of the TFT is formed on a first insulating layer, which is formed on the gate terminal.

In step 606, a second insulating layer is formed on the channel, source terminal, and drain terminal and a gate contact hole is formed through the second insulating layer. For example, the gate contact hole may be formed through a second insulating layer, such as second insulating layer 158 in FIG. 1, and the second insulating layer may be formed of a material such as silicon nitride. The gate contact hole may be, for example, etched in the second insulating layer using processes known to those of skill in the art, such as dry or wet etching using photoresist patterns.

In step 608 of method 600, a second gate terminal, such as second gate terminal 580 in FIGS. 5A and 5B, is formed on the second insulating layer and is electrically connected to the first gate terminal via the gate contact hole. In some example, the second gate terminal is formed of a reflective and conductive material, such as aluminum or other metals as are known by those of skill in the art. The second gate terminal may be formed by manufacturing processes known to those of skill in the art, such as photo lithographic and chemical processing methods. As described above, the second gate terminal may be formed so that it overlies an inter-terminal region of a semiconducting channel of the TFT, but does not overlie the source terminal and drain terminal adjacent to the semiconducting channel, such as depicted in FIGS. 5A and 5B. In other words, the second gate terminal can be formed to as to be substantially non-overlapping with one or more of the source terminal and the drain terminal. Further, the second gate terminal may be formed so that it has a width that is a percentage of the semiconducting channel width, such as greater than 50% of the channel width, greater than 60% of the channel width, greater than 70% of the channel width, greater than 80% of the channel width, greater than 90% of the channel width, substantially equal to the channel width, equal to the channel width, or others as would be appreciated by persons of skill in the art. Similarly, the second gate terminal may be formed so that it overlies a percentage of the semiconducting channel length, such as greater than 50% of the channel length, greater than 60% of the channel length, greater than 70% of the channel length, greater than 80% of the channel length, greater than 90% of the channel length, substantially equal to the channel length, equal to the channel length, or others as would be appreciated by persons of skill in the art.

In some examples, the second gate terminal is formed in the same manufacturing step, in other words, substantially simultaneously or concurrently with, a first electrode, such as first electrode 517 in FIGS. 5A and 5B. In such examples, the manufacturing process of the additional (second) gate terminal can be completed without additional manufacturing steps, which allows conventional manufacturing processes to be used when forming the second gate terminal of the electrowetting element.

In step 608 of method 600, the manufacturing of the display element may be completed. For example, additional layers and components may be formed, for example deposited, on the TFT. For example, one or more walls may be formed to confine one or more fluids to a display area of the display element. The display elements may then be filled with a plurality of fluids, such as at least the first and second fluids described above. Finally, additional layers, such as a top support plate, may be added and electrical interconnections made.

Notably, method 600 may include all of the aforementioned steps in some examples, and only a subset of the recited steps in other examples. In yet further examples, method 600 may include additional steps, such as the manufacturing of other aspects of an electrowetting element described herein.

Figure 7:
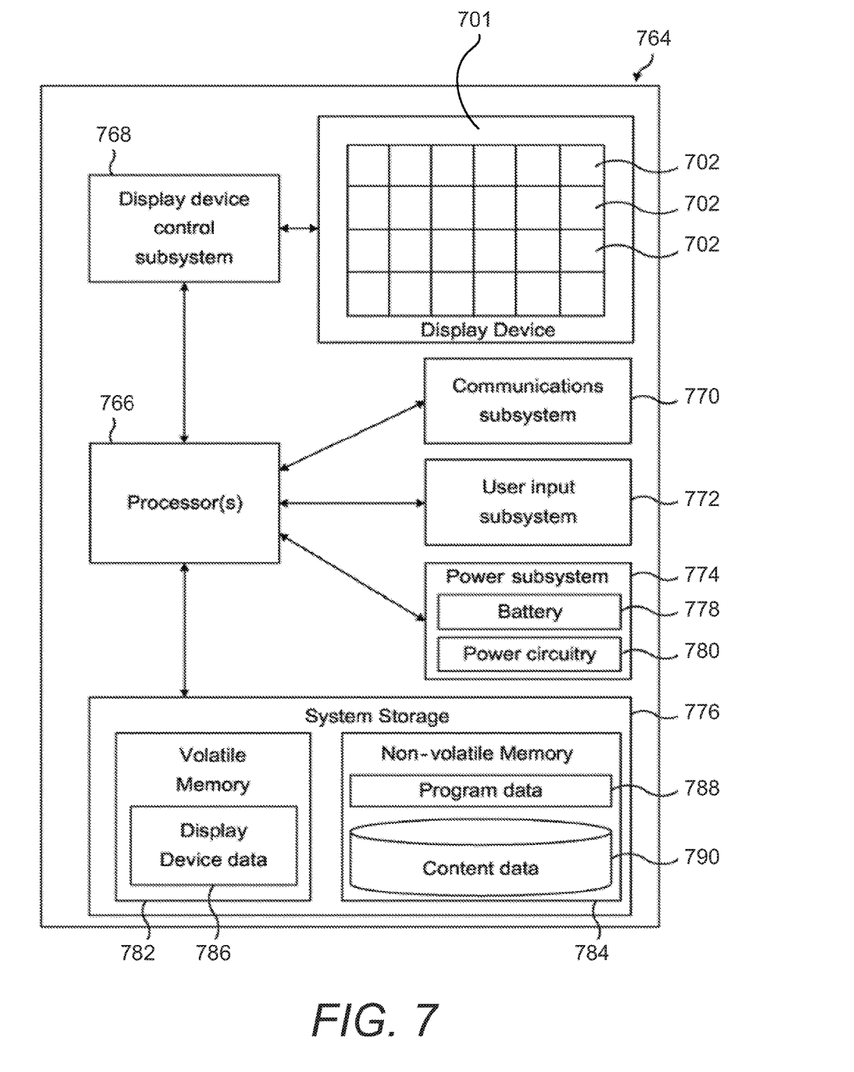
FIG. 7 shows a schematic system diagram of an example apparatus including an electrowetting display device.

FIG. 7 shows schematically a system diagram of an example system, for example apparatus 764, comprising an electrowetting display device such as the electrowetting display device 701 described above comprising electrowetting display elements 702. The apparatus is for example a portable, i.e. mobile, device such as an electronic reader device such as a so-called e-reader, a tablet computing device, a laptop computing device, a mobile telecommunications device, a watch or a satellite navigation device. In other examples, the apparatus may alternatively be a display screen for installation in any machine or device requiring a display screen, for example a consumer appliance.

The system diagram illustrates an example of a basic hardware architecture of the apparatus 764. The apparatus includes at least one processor 766 connected to and therefore in data communication with, for example: a display device control subsystem 768, a communications subsystem 770, a user input subsystem 772, a power subsystem 774, and system storage 776.

The display device control subsystem 768 is connected to and is therefore in data communication with the display device 701. The at least one processor 766 is, for example, a general purpose processor, a microprocessor, a digital signal processor (DSP), an application specific integrated circuit (ASIC), a field programmable gate array (FPGA) or other programmable logic device, a discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration. The processor may be coupled, via one or more buses, to read information from or write information to one or more memories, for example, those of the system storage 776. The at least one processor may additionally, or in the alternative, contain memory, such as processor registers, on-board cache, and others as are known by those of skill in the art.

The display device control subsystem 768 includes, for example, electrowetting display element driver components for use in applying a voltage to any of the electrowetting display elements 702. In examples, the electrowetting display elements 702 are configured according to an active matrix configuration and the display device control subsystem 768 is configured to control switching elements, such as thin film transistors (TFTs), of the display device 701 via circuitry to control the electrowetting display elements. The circuitry may include signal and control lines such as those described above.

The communications subsystem 770 is configured for the apparatus to communicate with, for example, a computing device via a data network, for example a computer network, such as: the Internet, a local area network, a wide area network, a telecommunications network, a wired network, a wireless network, or some other type of network. The communications subsystem 770 may further comprise an input/output (I/O) interface, such as: a universal serial bus (USB) connection, a Bluetooth or infrared connection, or a data network interface for connecting the apparatus to a data network such as any of those described above. In some examples, content data may be transferred to the apparatus via the communications subsystem 770.

The user input subsystem 772 may include, for example, an input device for receiving input from a user of the apparatus. Example input devices include, but are not limited to: a keyboard, a rollerball, buttons, keys, switches, a pointing device, a mouse, a joystick, a remote control, an infrared detector, a voice recognition system, a bar code reader, a scanner, a video camera (possibly coupled with video processing software to, e.g., detect hand gestures or facial gestures), a motion detector, a microphone (possibly coupled to audio processing software to, e.g., detect voice commands), or other device capable of transmitting information from a user to the device. The input device may also take the form of a touch-screen associated with the display device, in which case a user responds to prompts on the display device by touch. The user may enter textual information through the input device such as the keyboard or the touch-screen.

The apparatus may also include a user output subsystem (not illustrated) including, for example, an output device for providing output to a user of the apparatus. Examples of such output devices include, but are not limited to: a printing device, an audio output device including for example one or more speakers, headphones, earphones, alarms, or haptic output devices. The output device may be a connector port for connecting to one of the other output devices described, such as earphones.

The power subsystem 774 includes power circuitry 780 for use in transferring and controlling power consumed by the apparatus 764. The power may be provided by a mains electricity supply or from a battery 778, via the power circuitry 780. The power circuitry 780 may further be used for charging the battery from a mains electricity supply.

The system storage 776 includes at least one memory, for example, at least one of volatile memory 782 and non-volatile memory 784, and may comprise a non-transitory computer readable storage medium. The volatile memory may, for example, be a Random Access Memory (RAM). The non-volatile (NV) memory may, for example, be a solid state drive (SSD) such as Flash memory, or Read Only Memory (ROM). Further storage technologies may be used, for example, magnetic, optical or tape media, compact disc (CD), digital versatile disc (DVD), Blu-ray, or other data storage media as are known by those of skill in the art. The volatile memory 782 and/or non-volatile memory 784 may be removable or non-removable.

Any of the memories may store data for controlling apparatus 764, in particular components or subsystems of apparatus 764. Such data may, for example, be in the form of computer-readable and/or executable instructions, i.e., computer program instructions. Thus, at least one memory and the computer program instructions may be configured to, with the at least one processor 766, control a display effect provided by the electrowetting display device 701.

In the example of FIG. 7, volatile memory 782 stores, for example, display device data 786, which is indicative of display effects to be provided by the display device 701. The processor 766 may transmit data, based on the display device data, to the display device control subsystem 768, which thereafter outputs signals to the display device 701 for applying voltages to the display elements 702, which causes display effects from the display device 701. Non-volatile memory 784 stores, for example, program data 788 and/or content data 790.

Program data 788 is, for example, data representing computer executable instructions (e.g., in the form of computer software) used by apparatus 764 in order to run applications or program modules on apparatus 764. For example, program data 788 may cause components or subsystems of apparatus 764 to perform certain functions or tasks. An application or program module data includes any of routines, programs, objects, components, data structures or similar.

Content data 790 is, for example, data representing content representative of any form of media, including, for example: text, at least one image or a part thereof, at least one video or a part thereof, at least one sound or music or a part thereof. In some examples, data representing an image or a part thereof is, for example, representative of one or more display effects to be provided by at least one electrowetting element 702 of the electrowetting display device 701. The content data may include data representing a library of content, for example, a library of any of books, periodicals, newspapers, movies, videos, music, or podcasts, each of which may be represented by a collection of data which represents for example one book or one movie. Such a collection of data may include a mixture of content data of different types, for example, a movie may be represented by data including at least image data and sound data.

The above examples are to be understood as illustrative examples. Further examples are envisioned. It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the accompanying claims.

What is claimed is:

1. An electrowetting display element comprising:
   a first fluid;
   a second fluid immiscible with the first fluid;
   a wall;
   a substrate;
   an electrode; and
   a thin film transistor comprising:
      a first gate terminal on the substrate;
      a first insulating layer on the first gate terminal;
      a semiconducting channel on the first insulating layer, the semiconducting channel overlying at least a portion of the first gate terminal, and the semiconducting channel comprising a first material which generates a photocurrent in response to absorption of light by the first material;
      a source terminal on a first portion of the semiconducting channel;
      a drain terminal on a second portion of the semiconducting channel different from the first portion of the semiconducting channel;
      an inter-terminal region of the semiconducting channel located between the source terminal and the drain terminal;
      a second insulating layer on the semiconducting channel, the source terminal, and the drain terminal; and
      a second gate terminal on the second insulating layer, the second gate terminal overlying at least a portion of the inter-terminal region and underlying the wall, wherein the second gate terminal comprises a second material to shield the first material of the at least the portion of the inter-terminal region from absorption of light which would cause the first material to generate photocurrent.

2. The electrowetting display element according to claim 1, wherein a width of the second gate terminal is equal to a width of the inter-terminal region.

3. The electrowetting display element according to claim 1, wherein a width of the second gate terminal is less than a width of the inter-terminal region.

4. The electrowetting display element according to claim 1, wherein a width of the second gate terminal is greater than 50% of a width of the inter-terminal region.

5. The electrowetting display element according to claim 1, wherein a length of the second gate terminal overlying the semiconducting channel is equal to a length of the inter-terminal region.

6. The electrowetting display element according to claim 1, wherein a length of the second gate terminal overlying the semiconducting channel is less than a length of the inter-terminal region.

7. The electrowetting display element according to claim 1, wherein a length of the second gate terminal overlying the semiconducting channel is greater than 50% of a length of the inter-terminal region.

8. The electrowetting display element according to claim 1, wherein the second gate terminal comprises a reflective surface and the second material is conductive, and wherein the second gate terminal is configured to reflect light incident upon the second gate terminal away from the inter-terminal region.

9. The electrowetting display element according to claim 8, wherein the second material is one of aluminum, molybdenum, titanium, or copper.

10. The electrowetting display element according to claim 1, further comprising: a first contact hole electrically connected to the first gate terminal and the second gate terminal through the second insulating layer.

11. The electrowetting display element according to claim 1, wherein the electrode comprises a reflective material.

12. The electrowetting display element according to claim 1, wherein the second gate terminal is non-overlapping with the source terminal and the drain terminal.

13. The electrowetting display element according to claim 1, further comprising:
a first capacitor plate;
a second capacitor plate positioned above the first capacitor plate and integral with the drain terminal; and
a second contact hole electrically connected to the first capacitor plate and the second capacitor plate through the first insulating layer.

14. A method of manufacturing an electrowetting display element, comprising:
forming a first gate terminal of a thin film transistor on a substrate;
forming a first insulating layer of the thin film transistor on the first gate terminal;
forming a semiconducting channel of the thin film transistor on the first insulating layer, the semiconducting channel overlying at least a portion of the first gate terminal, and the semiconducting channel comprising a first material which generates a photocurrent in response to absorption of light by the first material;
forming a source terminal of the thin film transistor on a first portion of the semiconducting channel;
forming a drain terminal of the thin film transistor on a second portion of the semiconducting channel different from the first portion of the semiconducting channel, thereby forming an inter-terminal region of the semiconducting channel located between the source terminal and the drain terminal;
forming a second insulating layer of the thin film transistor on the semiconducting channel, the source terminal, and the drain terminal; and
forming a second gate terminal of the thin film transistor on the second insulating layer and overlying at least a portion of the inter-terminal region, the second gate terminal comprising a second material to shield the first material of the at least portion of the inter-terminal region from absorption of light which would cause the first material to generate photocurrent;
forming an electrode on the second insulating layer; and
forming a wall overlying the second gate terminal.

15. The method according to claim 14, wherein a width of the second gate terminal is equal to a width of the inter-terminal region.

16. The method according to claim 14, wherein a width of the second gate terminal is less than a width of the inter-terminal region.

17. The method according to claim 14, wherein a width of the second gate terminal is greater than 50% of a width of the inter-terminal region.

18. The method according to claim 14, wherein a length of the second gate terminal overlying the semiconducting channel is greater than 50% of a length of the inter-terminal region of the semiconducting channel.

19. The method according to claim 14, wherein a length of the second gate terminal overlying the semiconducting channel is less than a length of the inter-terminal region.

20. The method according to claim 14, wherein the second gate terminal comprises a reflective surface and the second material is conductive, and wherein the second gate terminal is configured to reflect light incident upon the second gate terminal away from the inter-terminal region.

21. The method according to claim 14, wherein the second gate terminal comprises a reflective surface and the second material is conductive.

22. The method according to claim 21, wherein the second material is one of aluminum, molybdenum, titanium, or copper.

23. The method according to claim 14, further comprising: forming the electrode on the second insulating layer at least partly during the forming the second gate terminal of the thin film transistor on the second insulating layer.

24. The method according to claim 14, further comprising:
forming a first contact hole in the second insulating layer; and
electrically connecting the first gate terminal and the second gate terminal via the first contact hole.

25. The method of claim 14, wherein the electrode comprises a reflective material.

26. An apparatus, comprising:
a first fluid;
a second fluid immiscible with the first fluid;
a wall;
a substrate;
an electrode;
a thin film transistor comprising:
a first gate terminal on the substrate;
a first insulating layer on the first gate terminal;
a semiconducting channel on the first insulating layer, the semiconducting channel overlying at least a portion of the first gate terminal, and the semiconducting channel comprising a first material which generates a photocurrent in response to absorption of light by the first material;
a source terminal on a first portion of the semiconducting channel;
a drain terminal on a second portion of the semiconducting channel, different from the first portion of the semiconducting channel;
an inter-terminal region of the semiconducting channel located between the source terminal and the drain;
a second insulating layer on the semiconducting channel, the source terminal, and the drain terminal; and a second gate terminal on the second insulating layer, the second gate terminal overlying at least a portion of the inter-terminal region and underlying the wall, wherein the second gate terminal comprises a second material to shield the first material of the at least portion of the inter-terminal region from absorption of light which would cause the first material to generate photocurrent;

at least one processor; and at least one memory comprising computer program instructions, the at least one memory and the computer program instructions being configured to, with the at least one processor, control the thin film transistor.

27. The apparatus according to claim 26, wherein a width of the second gate terminal is greater than 50% of a width of the inter-terminal region.

28. The apparatus according to claim 26, further comprising: a first contact hole electrically connected to the first gate terminal and the second gate terminal through the second insulating layer.

29. The apparatus according to claim 26, wherein the second gate terminal comprises a reflective surface and the second material is conductive, and wherein the second gate terminal is configured to reflect light incident upon the second gate terminal away from the inter-terminal region.

30. The apparatus according to claim 26, wherein the electrode comprises a reflective material.

* * * * *

UNITED STATES PATENT AND TRADEMARK OFFICE
CERTIFICATE OF CORRECTION

PATENT NO. : 10,031,332 B1  
APPLICATION NO. : 14/980752  
DATED : July 24, 2018  
INVENTOR(S) : Sakai et al.

Page 1 of 1

It is certified that error appears in the above-identified patent and that said Letters Patent is hereby corrected as shown below:

In the Claims

In Column 17, Line 67, in Claim 14, delete "least portion" and insert -- least the portion --, therefor.

In Column 18, Line 65, in Claim 26, delete "drain;" and insert -- drain terminal; --, therefor.

In Column 19, Line 5, in Claim 26, delete "least" and insert -- least the --, therefor.

Signed and Sealed this  
Twenty-third Day of July, 2019

Andrei Iancu  
*Director of the United States Patent and Trademark Office*